US012787619B2

(12) United States Patent
Hwang et al.

(10) Patent No.: US 12,787,619 B2
(45) Date of Patent: Nov. 3, 2026

(54) DISPLAY DEVICE

(71) Applicant: LG Display Co., Ltd., Seoul (KR)

(72) Inventors: Yooji Hwang, Siheung-si (KR); JungSun Baek, Paju-si (KR); Yongmin Kim, Anyang-si (KR); Seungpyo Hong, Busan (KR)

(73) Assignee: LG Display Co., Ltd., Seoul (KR)

( * ) Notice: Subject to any disclaimer, the term of this patent is extended or adjusted under 35 U.S.C. 154(b) by 298 days.

(21) Appl. No.: 18/493,339

(22) Filed: Oct. 24, 2023

(65) Prior Publication Data

US 2024/0224766 A1 Jul. 4, 2024

(30) Foreign Application Priority Data

Dec. 30, 2022 (KR) ........................ 10-2022-0190889

(51) Int. Cl.

| | |
|---|---|
| ***H10K 59/80*** | (2023.01) |
| ***H10K 59/35*** | (2023.01) |
| ***H10K 59/38*** | (2023.01) |
| ***H10K 59/40*** | (2023.01) |

(52) U.S. Cl.

CPC ....... *H10K 59/8792* (2023.02); *H10K 59/353* (2023.02); *H10K 59/38* (2023.02); *H10K 59/40* (2023.02); *H10K 59/80515* (2023.02); *H10K 59/873* (2023.02); *H10K 59/878* (2023.02)

(58) Field of Classification Search

None

See application file for complete search history.

(56) References Cited

U.S. PATENT DOCUMENTS

| | | | | |
|---|---|---|---|---|
| 10,809,829 | B2 | 10/2020 | Lee et al. | |
| 11,237,659 | B2 | 2/2022 | Kim et al. | |
| 11,726,594 | B2 | 8/2023 | Kim et al. | |
| 12,010,899 | B1 * | 6/2024 | Lee | G06F 3/0443 |
| 12,141,386 | B2 * | 11/2024 | Bae | G06F 3/0412 |
| 2015/0049030 | A1 | 2/2015 | Her | |
| 2017/0090634 | A1 * | 3/2017 | Yang | H10K 59/873 |
| 2018/0095567 | A1 | 4/2018 | Lee et al. | |

(Continued)

FOREIGN PATENT DOCUMENTS

| | | |
|---|---|---|
| KR | 10-2015-0020929 A | 2/2015 |
| KR | 10-2016-0080959 A | 7/2016 |

(Continued)

OTHER PUBLICATIONS

Ministry of Intellectual Property of Korea, Office Action, Korean Patent Application No. 10-2022-0190889, Aug. 26, 2026, 14 pages.

*Primary Examiner* — Nishath Yasmeen

(74) *Attorney, Agent, or Firm* — Fenwick & West LLP

(57) ABSTRACT

A display device according includes a substrate divided into a plurality of unit areas; a plurality of sub-pixels disposed in each of the plurality of unit areas of the substrate; an encapsulation unit disposed on the plurality of sub-pixels; a black matrix disposed on the encapsulation unit and having an open area corresponding to an emission area of each of the plurality of sub-pixels; and at least one touch electrode disposed on an upper surface and a side surface of the black matrix, thereby performing a touch function and improving light extraction efficiency.

14 Claims, 5 Drawing Sheets

(56) References Cited

U.S. PATENT DOCUMENTS

| | | | | |
|---|---|---|---|---|
| 2019/0129539 | A1* | 5/2019 | Kim | G06F 3/0446 |
| 2020/0194713 | A1* | 6/2020 | Kim | H10K 50/818 |
| 2021/0132723 | A1* | 5/2021 | Kim | G06F 3/0412 |
| 2021/0405797 | A1* | 12/2021 | Bae | G06F 3/0412 |
| 2022/0107700 | A1 | 4/2022 | Kim et al. | |
| 2022/0382402 | A1 | 12/2022 | Kim et al. | |
| 2023/0137666 | A1* | 5/2023 | Lee | H10K 59/124 257/40 |

FOREIGN PATENT DOCUMENTS

| | | | |
|---|---|---|---|
| KR | 10-2018-0036324 | A | 4/2018 |
| KR | 10-2019-0070909 | A | 6/2019 |
| KR | 10-2075728 | B1 | 2/2020 |
| KR | 10-2021-0054390 | A | 5/2021 |

* cited by examiner

DISPLAY DEVICE

CROSS-REFERENCE TO RELATED APPLICATION

This application claims the benefit of and priority to Republic of Korea Patent Application No. 10-2022-0190889 filed on Dec. 30, 2022 in the Republic of Korea, which is hereby incorporated by reference in its entirety.

TECHNICAL FIELD

The present disclosure relates to a display device, and more particularly, to a display device having improved light extraction efficiency.

DISCUSSION OF THE RELATED ART

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Among various display devices, an electroluminescent display device is a self-luminous display device and can be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices have been expected to be used in various application fields.

Meanwhile, light emitted from a light emitting layer of the electroluminescent display device passes through various components of the electroluminescent display device and comes out of the electroluminescent display device. However, a portion of the light emitted from the light emitting layer does not come out of the electroluminescent display device and is trapped inside the electroluminescent display device, causing deficiency in light extraction efficiency of the electroluminescent display device.

SUMMARY

An object to be achieved by the present disclosure is to provide a display device allowing for improvements in luminous efficiency and luminance viewing angle by preventing or at least reducing a portion of light from being absorbed by a black matrix.

Another object to be achieved by the present disclosure is to provide a display device in which a reduction in visibility due to reflection of external light is minimized or at least reduced.

Still another object to be achieved by the present disclosure is to provide a display device capable of performing a touch function by forming touch electrodes on an encapsulation unit.

Objects of the present disclosure are not limited to the above-mentioned objects, and other objects, which are not mentioned above, can be clearly understood by those skilled in the art from the following descriptions.

A display device according to an exemplary embodiment of the present disclosure includes a substrate divided into a plurality of unit areas; a plurality of sub-pixels disposed in each of the plurality of unit areas of the substrate; an encapsulation unit disposed on the plurality of sub-pixels; a black matrix disposed on the encapsulation unit and having an open area corresponding to an emission area of each of the plurality of sub-pixels; and at least one touch electrode disposed on an upper surface and a side surface of the black matrix, thereby performing a touch function and improving light extraction efficiency.

Other detailed matters of the exemplary embodiments are included in the detailed description and the drawings.

A display device according to an exemplary embodiment of the present disclosure may perform a touch function by disposing touch electrodes for touch sensing in each of a plurality of unit areas.

A display device according to an exemplary embodiment of the present disclosure can prevent reflection of external light by disposing an external light antireflection layer including two color filters of different colors on touch electrodes, so that visibility of the display device can be improved.

In a display device according to an exemplary embodiment of the present disclosure, luminous efficiency can be more effectively improved by disposing touch electrodes on an inner surface of the black matrix.

The effects according to the present disclosure are not limited to the contents exemplified above, and more various effects are included in the present specification.

DETAILED DESCRIPTION

Figure 1:
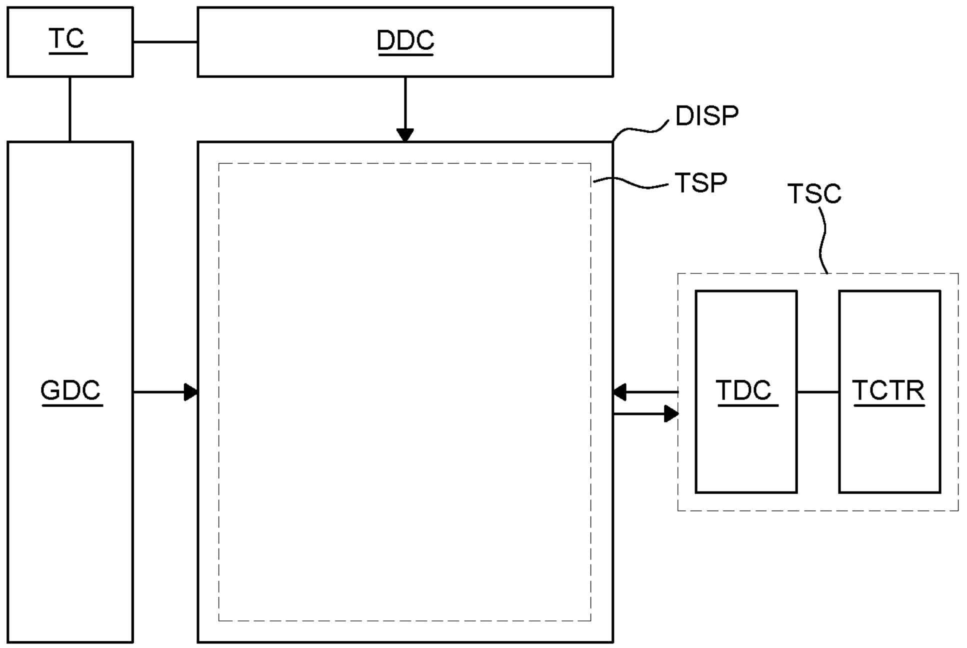
FIG. 1 is a diagram schematically illustrating a configuration of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as 'including', 'having', 'comprising' used herein are generally intended to allow other components to be added unless the terms are used with the term 'only'. Any references to singular may include plural unless expressly stated otherwise.

Components are interpreted to include an ordinary error range even if not expressly stated.

When the position relation between two parts is described using the terms such as 'on', 'above', 'below', 'next', one or more parts may be positioned between the two parts unless the terms are used with the term 'immediately' or 'directly'.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

FIG. 1 is a diagram schematically illustrating a configuration of a display device according to an exemplary embodiment of the present disclosure.

For example, FIG. 1 shows a schematic configuration of a display device in which a touch panel TSP is embedded according to an exemplary embodiment of the present disclosure. However, the present disclosure is not limited thereto, and the display device according to an exemplary embodiment of the present disclosure may include no touch panel.

Referring to FIG. 1, the display device according to an exemplary embodiment of the present disclosure may provide both an image display function and a touch sensing function.

To provide the image display function, the display device according to an exemplary embodiment of the present disclosure may include a display panel DISP, a gate driving circuit GDC, a data driving circuit DDC, and a timing controller TC.

For example, a plurality of data lines and a plurality of gate lines may be disposed on the display panel DISP, and a plurality of sub-pixels defined by the plurality of data lines and the plurality of gate lines may be arranged thereon.

The data driving circuit DDC may drive the plurality of data lines, the gate driving circuit GDC may drive the plurality of gate lines, and the timing controller TC may control operations of the data driving circuit DDC and the gate driving circuit GDC.

Each of the data driving circuit DDC, the gate driving circuit GDC, and the timing controller TC may be implemented as one or more individual components. In some cases, two or more of the data driving circuit DDC, the gate driving circuit GDC, and the timing controller TC may be integrated and implemented as one component. For example, the data driving circuit DDC and the timing controller TC may be implemented as one integrated circuit chip (IC Chip).

In order to provide the touch sensing function, the display device according to an exemplary embodiment of the present disclosure may include the touch panel TSP that includes a plurality of touch electrodes and a touch sensing circuit TSC that supplies a touch driving signal to the touch panel TSP, detects a touch sensing signal from the touch panel TSP, and based on the detected touch sensing signal, senses whether or not a user's touch has been present or a touch location (touch coordinates) on the touch panel TSP.

For example, the touch sensing circuit TSC may include a touch driving circuit TDC that supplies the touch driving signal to the touch panel TSP and detects the touch sensing signal from the touch panel TSP, and a touch controller TCTR that senses whether or not a user's touch has been present and/or a touch location on the touch panel TSP based on the touch sensing signal detected by the touch driving circuit TDC. The touch driving circuit TDC may include a first circuit part supplying the touch driving signal to the touch panel TSP and a second circuit part detecting the touch sensing signal from the touch panel TSP.

For example, the touch driving circuit TDC and the touch controller TCTR may be implemented as separate parts or, in some cases, may be integrated and implemented as one part.

For example, each of the data driving circuit DDC, the gate driving circuit GDC, and the touch driving circuit TDC may be implemented as one or more integrated circuits. In addition, in terms of electrical connection with the display panel DISP, each of the data driving circuit DDC, the gate driving circuit GDC, and the touch driving circuit TDC may be implemented as a chip-on-glass (COG) type, a chip-on-film (COF) type, or a tape carrier package (TCP) type, and the gate driving circuit GDC may also be implemented as a gate-in-panel (GIP) type.

For example, each of circuit components DDC, GDC, and TC for display driving and circuit components TDC and TCTR for touch sensing may be implemented as one or more separate components. In some cases, one or more of the circuit components DDC, GDC, and TC for display driving and one or more of the circuit components TDC and TCTR for touch sensing may be functionally integrated and implemented as one or more parts.

For example, the data driving circuit DDC and the touch driving circuit TDC may be integrated into and implemented in one or more integrated circuit chips. When the data driving circuit DDC and the touch driving circuit TDC are integrated into and implemented in two or more integrated circuit chips, each of the two or more integrated circuit chips may have a data driving function and a touch driving function.

Meanwhile, examples of the display device according to an exemplary embodiment of the present disclosure may include various types such as a light emitting display device, a liquid crystal display device and the like. Hereinafter, for convenience of explanation, the display device will be described as a light emitting display device, by way of example. That is, examples of the display panel DISP may include various types such as a light emitting display panel, a liquid crystal display panel and the like. However, hereinafter, for convenience of description, the display panel DISP will be described as a light emitting display panel, by way of example.

Meanwhile, as will be described later, the touch panel TSP may include a plurality of touch electrodes to which the touch driving signal can be applied or from which the touch sensing signal can be detected, and a plurality of touch routing lines for connecting the plurality of touch electrodes with the touch driving circuit TDC.

The touch panel TSP may exist outside the display panel DISP. That is, the touch panel TSP and the display panel DISP may be separately manufactured and combined. The touch panel TSP is referred to as an external type or an add-on type.

Alternatively, the touch panel TSP may be embedded in the display panel DISP. That is, when manufacturing the display panel DISP, touch sensor structures such as the plurality of touch electrodes and the plurality of touch routing lines constituting the touch panel TSP may be formed together with a plurality of electrodes and signal lines for display driving.

Also, the touch panel TSP may be directly formed on an upper portion of an encapsulation unit of the display panel DISP. That is, touch insulating layers and the touch electrodes are patterned on the upper portion of the encapsulation unit and connected to signal lines formed as electrodes for display driving, so that it can be driven. Hereinafter, for convenience of explanation, a case in which the touch panel TSP is directly formed on the upper portion of the encapsulation unit (touch on encapsulation type (TOE type)) will be described as an example.

Figure 2:
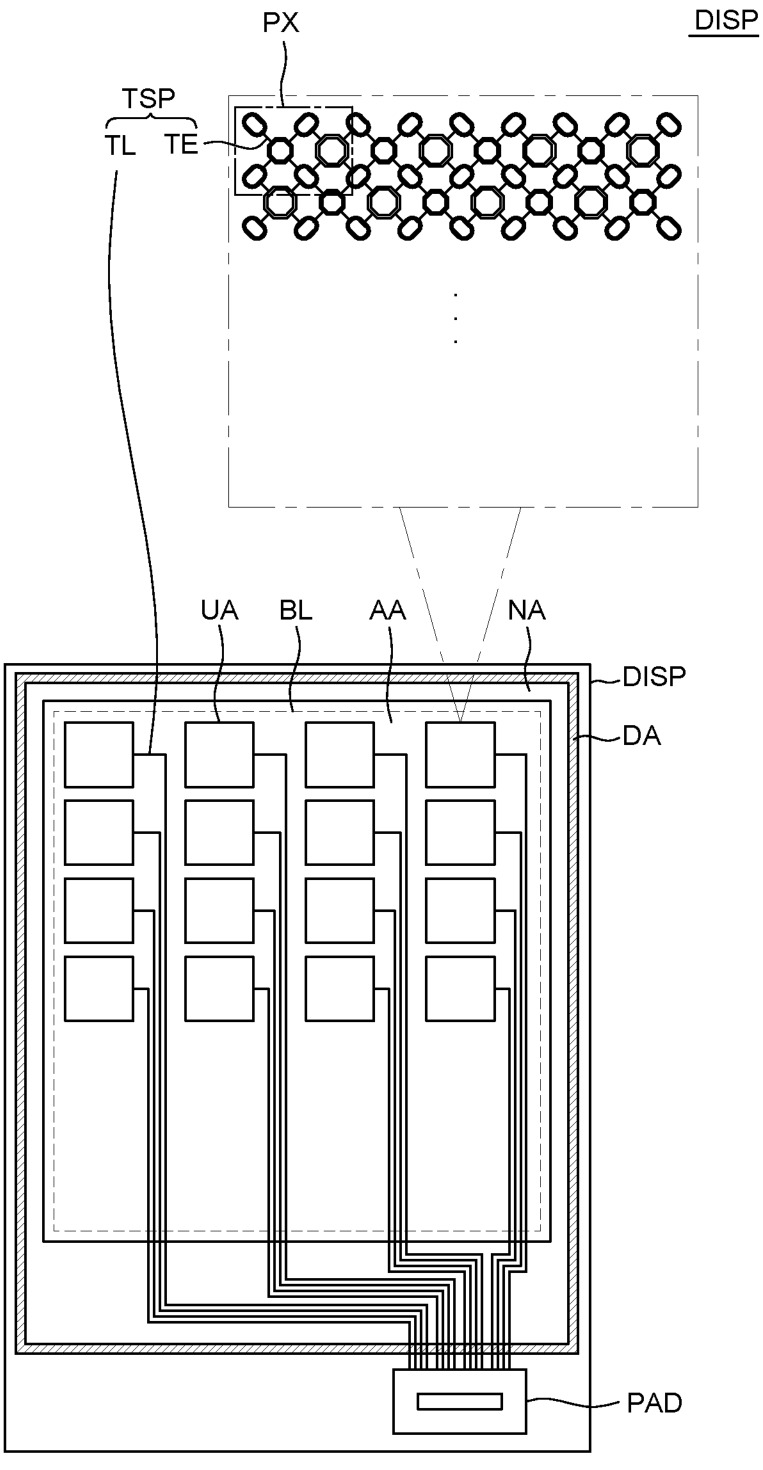
FIG. 2 is a view schematically illustrating a display panel of FIG. 1 according to an exemplary embodiment of the present disclosure.

FIG. 2 is a view schematically illustrating a display panel of FIG. 1 according to an exemplary embodiment of the present disclosure.

Figure 3:
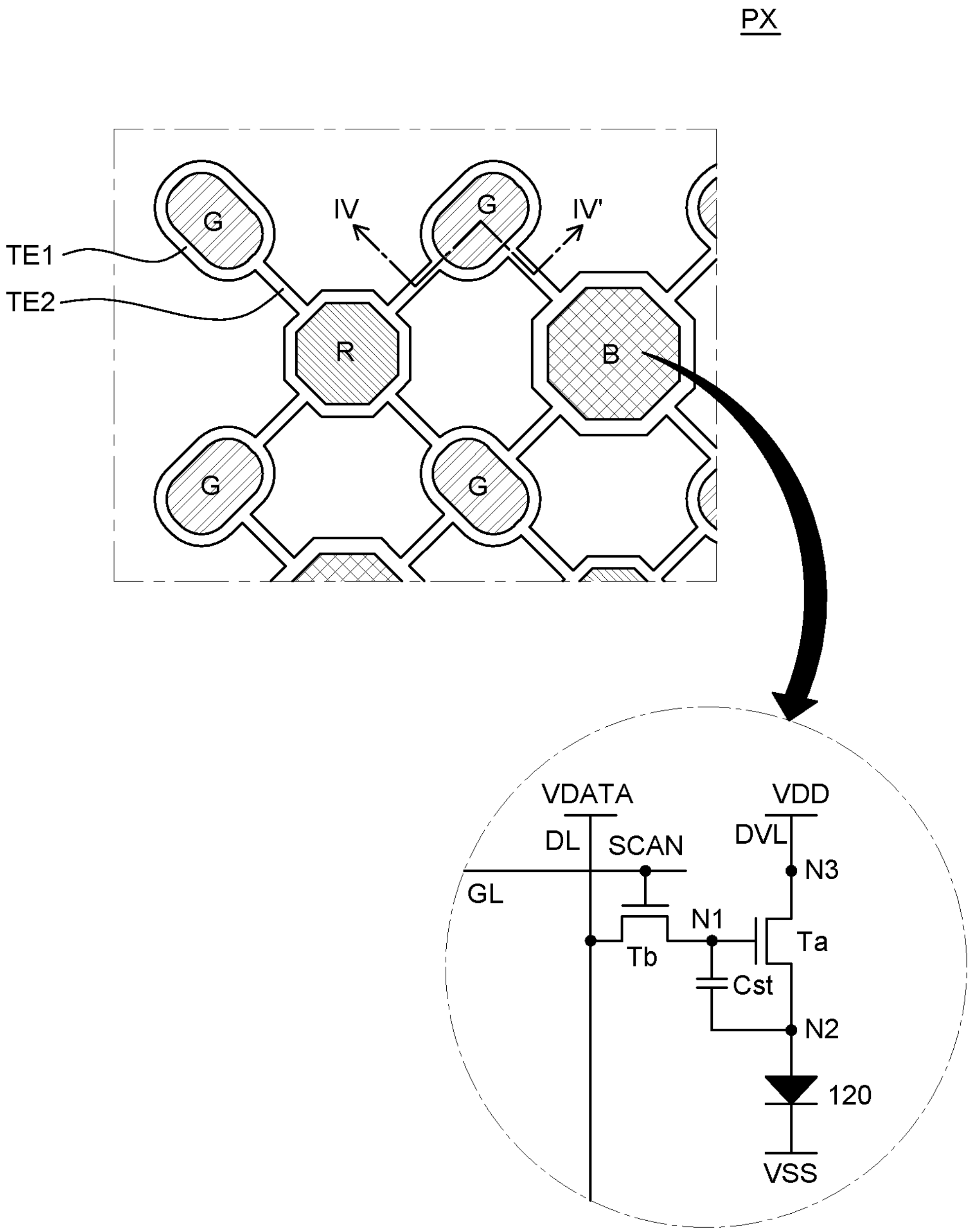
FIG. 3 is an enlarged view of pixels and touch electrodes of the display device according to an exemplary embodiment of the present disclosure according to an exemplary embodiment of the present disclosure.

FIG. 3 is an enlarged view of pixels and touch electrodes of the display device according to an exemplary embodiment of the present disclosure.

Figure 4:
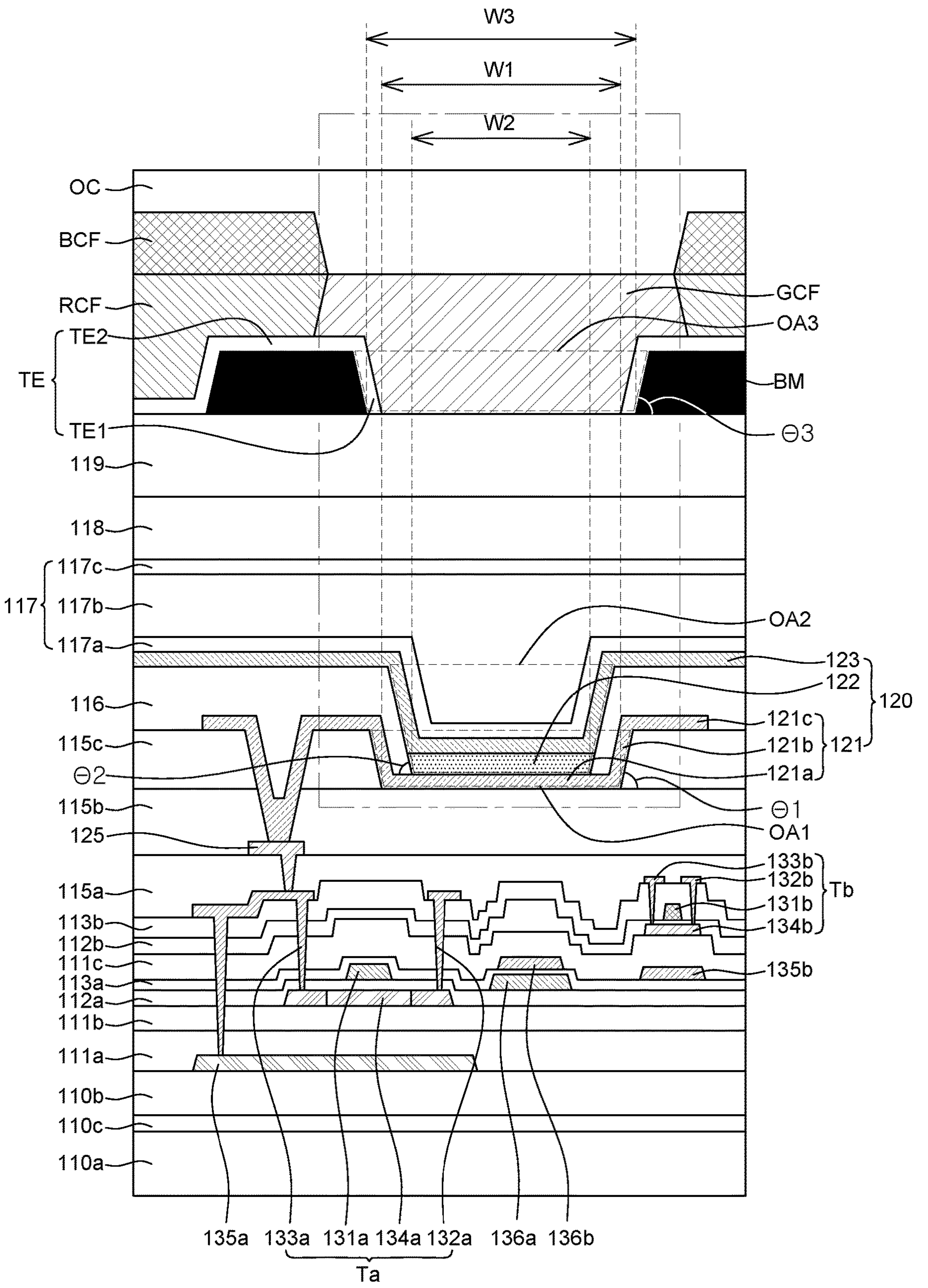
FIG. 4 is a view showing a cross-section taken along line IV-IV' of FIG. 3 according to an exemplary embodiment of the present disclosure.

FIG. 4 is a view showing a cross-section taken along line IV-IV' of FIG. 3 according to an exemplary embodiment of the present disclosure.

Specifically, in FIG. 2, a plan view of the display panel DISP on which the touch panel TSP is disposed and an enlarged plan view of a unit area UA are shown.

Also, in FIG. 3, a plan view of one pixel PX and a touch electrode TE disposed adjacent thereto and a circuit diagram of one sub-pixel R, G, or B are shown.

Also, FIG. 4 shows a part of a cross-sectional structure of one sub-pixel R, G, or B and the touch electrode TE disposed adjacent thereto in the display panel according to an exemplary embodiment of the present disclosure.

Referring to FIG. 2, the display panel DISP may include an active area AA where an image is displayed and a non-active area NA that is an outer area of an outer boundary line BL of the active area AA.

The active area AA of the display panel DISP may include a plurality of unit areas UA. A plurality of pixels PX for displaying an image may be disposed in each of the plurality of unit areas UA. In addition, various electrodes or signal lines for display driving of the plurality of pixels PX are disposed in each of the plurality of unit areas UA.

Referring to FIG. 3, each of the plurality of pixels PX may include sub-pixels R, G, and B of different colors. For example, each of the plurality of pixels PX may include a red sub-pixel R emitting red light, a green sub-pixel G emitting green light, and a blue sub-pixel B emitting blue light. More specifically, four green sub-pixels G, one red sub-pixel R, and one blue sub-pixel B in different shapes may be disposed in one pixel PX, and the one red sub-pixel R or one blue sub-pixel B may be disposed in a central portion of the four green sub-pixels G disposed in corners of a square. However, an arrangement relationship of a plurality of the sub-pixels R, G, and B is not limited thereto and may be variously changed according to a necessity of design.

Also, referring to FIG. 2, touch electrodes TE for touch sensing may be disposed in each of the plurality of unit areas UA of the display panel DISP. Also, touch routing lines TL that are electrically connected to the touch electrodes TE may be disposed in areas between the plurality of unit areas UA in the active area AA. A plurality of the touch electrodes TE and a plurality of the touch routing lines TL described above may configure the touch panel TSP. Accordingly, the active area AA of the display panel DISP in which the touch panel TSP is formed may also be referred to as a touch sensing area allowing for touch sensing.

Referring to FIG. 3, the touch electrode TE may include a plurality of first touch electrodes TE1 disposed in outer edges of the plurality of sub-pixels R, G, and B and a plurality of second touch electrodes TE2 connecting the plurality of first touch electrodes TE1. In other words, the touch electrode TE may include the plurality of first touch electrodes TE1 in contact with boundaries of the plurality of sub-pixels R, G, and B and the plurality of second touch electrodes TE2 disposed between the boundaries of the plurality of sub-pixels R, G, and B.

As described above, since four green sub-pixels G, one red sub-pixel R, and one blue sub-pixel B in different shapes are disposed in one pixel PX, shapes of the plurality of first touch electrodes TE1 may also be variously changed according to shapes of the plurality of sub-pixels R, G, and B. In addition, although it is illustrated that the plurality of second touch electrodes TE2 have a shape of straight lines connected between the plurality of first touch electrodes TE1, the present disclosure is not limited thereto, and the plurality of second touch electrodes TE2 may be deformed in a curved shape.

Accordingly, the plurality of first touch electrodes TEL and the plurality of second touch electrodes TE2 disposed in one unit area UA may constitute one touch electrode TE. Also, one touch electrode TE disposed in one unit area UA may be connected to one touch routing line TL.

Meanwhile, in the non-active area NA of the display panel DISP, link lines to which various signal lines disposed in the active area AA extend or link lines which are electrically connected to the various signal lines disposed in the active area AA, and pads which are electrically connected to the link lines may be disposed. A display driving circuit may be bonded to or electrically connected to the pads disposed in the non-active area NA.

In addition, in the non-active area NA of the display panel DISP, link lines to which the plurality of touch routing lines TL disposed in the active area AA extend or link lines which are electrically connected to the plurality of touch routing lines TL disposed in the active area AA, and pads PAD which are electrically connected to the link lines may be disposed. A touch driving circuit may be bonded to or electrically connected to the pads PAD disposed in the non-active area NA.

Meanwhile, in the non-active area NA, parts of outermost touch electrodes TE among the plurality of touch electrodes TE disposed in the active area AA may be expanded, and one or more electrodes (touch electrodes) formed of the same material as the plurality of touch electrodes TE disposed in the active area AA may be further disposed.

That is, all of the plurality of touch electrodes TE disposed in the display panel DISP exist within the active area AA, or some (e.g., the outermost touch electrodes) of the plurality of touch electrodes TE disposed in the display panel DISP may be present in the non-active area NA, or some (e.g., the outermost touch electrodes) of the plurality of touch electrodes TE disposed in the display panel DISP may be present throughout the active area AA and the non-active area NA.

Meanwhile, referring to FIG. 2, the display panel DISP according to an exemplary embodiment of the present disclosure may include a dam area DA where a dam portion for preventing any layer (e.g., the encapsulation unit of the display panel) within the active area AA from going over an outside of the display panel DISP is disposed.

The dam area DA may be located at a boundary between the active area AA and the non-active area NA or at any one point of the non-active area NA which is an outer area of the active area AA.

The dam portion disposed in the dam area DA may be disposed to enclose the active area AA in all directions, or may be disposed only outside one portion or two or more portions of the active area AA.

The dam portion disposed in the dam area DA may be formed as one pattern which is entirely connected, or may be formed in two or more patterns which are disconnected. Also, in the dam area DA, only a primary dam portion may be disposed, two dam portions (the primary dam portion and a secondary dam portion) may be disposed, or three or more dam portions may be disposed.

For example, in the dam area DA, there may be only a primary dam portion in one direction, and both the primary dam portion and a secondary dam portion may exist in another direction.

Referring to FIG. 3, each of the sub-pixels R, G, and B may include a light emitting element 120, a first transistor Ta for driving the light emitting element 120, a second transistor Tb for transmitting a data voltage VDATA to a first node N1 of the first transistor Ta, a storage capacitor Cst for maintaining a constant voltage during one frame, and the like.

For example, the first transistor Ta may include the first node N1 to which the data voltage VDATA can be applied, a second node N2 electrically connected to the light emitting element 120, and a third node N3 to which a driving voltage VDD is applied from a driving voltage line DVL. The first node N1 may be a gate node, the second node N2 may be a source node or a drain node, and the third node N3 may be a drain node or a source node. The first transistor Ta may be referred to as a driving transistor that drives the light emitting element 120.

The light emitting element 120 may include a first electrode (e.g., anode), a light emitting layer, and a second electrode (e.g., cathode). The first electrode may be electrically connected to the second node N2 of the first transistor Ta, and a ground voltage VSS may be applied to the second electrode.

In the light emitting element 120, the light emitting layer may include an organic material or an inorganic material.

For example, an on/off operation of the second transistor Tb is controlled by a scan signal SCAN that is applied through a gate line GL, and the second transistor Tb may be electrically connected between the first node N1 of the first transistor Ta and a data line DL. Also, the second transistor Tb may be referred to as a switching transistor.

For example, when the second transistor Tb is turned on by the scan signal SCAN, the data voltage VDATA which is supplied from the data line DL can be transmitted to the first node N1 of the first transistor Ta.

Also, the storage capacitor Cst may be electrically connected between the first node N1 and the second node N2 of the first transistor Ta.

As shown in FIG. 3, each of the sub-pixel R, G, and B may have a 2T1C structure including two transistors Ta and Tb and one capacitor Cst. In some cases, it may further include one or more transistors, or may further include one or more capacitors.

The storage capacitor Cst may be an external capacitor intentionally designed outside the first transistor Ta, not a parasitic capacitor (e.g., Cgs or Cgd), which is an internal capacitor that may exist between the first node N1 and the second node N2 of the first transistor Ta.

The first transistor Ta and the second transistor Tb may include an n-type transistor or p-type transistor. As described above, circuit elements such as the light emitting element 120, two or more transistors Ta and Tb, and at least one capacitor Cst are disposed in the display panel. Since this circuit element (particularly, the light emitting element 120) is vulnerable to external moisture or oxygen, an encapsulation unit 117 for preventing penetration of external moisture or oxygen into the circuit element may be disposed in the display panel, as shown in FIG. 4.

The encapsulation unit 117 may be formed of one layer, but may be formed of a plurality of layers 117*a*, 117*b*, and 117*c*.

Meanwhile, in the display device according to an exemplary embodiment of the present disclosure, the touch panel TSP may be disposed above the encapsulation unit 117.

That is, in the display device according to an exemplary embodiment of the present disclosure, the touch sensor structures such as the plurality of touch electrodes TE constituting the touch panel TSP may be disposed above the encapsulation unit 117.

During touch sensing, the touch driving signal or the touch sensing signal may be applied to the touch electrodes TE. Therefore, during touch sensing, a potential difference may be formed between the touch electrodes TE and the cathode disposed with the encapsulation unit 117 interposed therebetween, causing an unnecessary parasitic capacitance. In this case, the parasitic capacitance may decrease touch sensitivity. Thus, in order to reduce the parasitic capacitance, a distance between the touch electrodes TE and the cathode can be designed to be a certain value (1 μm) or more in consideration of a thickness of the display panel, a manufacturing process of the display panel, and display performance. To this end, for example, a thickness of the encapsulation unit 117 may be designed to be at least 1 μm.

Meanwhile, the display device according to an exemplary embodiment of the present disclosure may sense a touch based on a capacitance formed in the touch electrode TE.

The display device according to an exemplary embodiment of the present disclosure is in a capacitance-based touch sensing method, and a case where its touch sensing is performed in a self-capacitance-based touch sensing method is exemplified. However, touch sensing of the display device may be performed in a mutual-capacitance-based touch sensing method.

For example, as shown in FIG. 2, in the case of the self-capacitance-based touch sensing method, each of the touch electrodes TE serves as both a driving touch electrode and a sensing touch electrode. That is, the touch sensing circuit may apply a touch driving signal to one or more touch electrodes TE, detect a touch sensing signal through the touch electrodes TE to which the touch driving signal is applied, and sense whether a touch has been present and/or touch coordinates by determining a change in capacitance between a pointer such as a finger, a pen or the like and the touch electrode TE, based on the detected touch sensing signal. In the self-capacitance-based touch sensing method, there is no distinction between the driving touch electrode and the sensing touch electrode.

In addition, although not shown, in the case of the mutual-capacitance-based touch sensing method, a plurality of touch electrodes can be classified into the driving touch electrode (transmission touch electrode) to which the touch driving signal is applied, and the sensing touch electrode (receiving touch electrode) from which the touch sensing signal is detected and which forms a capacitance with the driving touch electrode.

In the case of the mutual-capacitance-based touch sensing method, the touch sensing circuit may sense whether or not a touch has been present and/or touch coordinates based on a change in capacitance (mutual-capacitance) between the driving touch electrode and the sensing touch electrode according to presence or absence of a pointer such as a finger or a pen.

Hereinafter, a configuration of the sub-pixel will be described in detail with reference to drawings.

Referring to FIG. 4, a driving transistor Ta, a switching transistor Tb, and the light emitting element 120 may be disposed above substrates 110*a*, 110*b*, and 110*c*.

For example, the substrates 110*a*, 110*b*, and 110*c* may include a first substrate 110*a*, a second substrate 110*b*, and an interlayer insulating layer 110*c*. The interlayer insulating layer 110*c* may be disposed between the first substrate 110*a* and the second substrate 110*b*.

In this manner, by configuring the substrates 110*a*, 110*b*, and 110*c* with the first substrate 110*a*, the second substrate 110*b*, and the interlayer insulating layer 110*c*, moisture permeation can be prevented or at least reduced. For example, the first substrate 110*a* and the second substrate 110*b* may be polyimide (PI) substrates.

Transistors such as the driving transistor Ta and the switching transistor Tb may be disposed on the substrates 110*a*, 110*b*, and 110*c*.

A multi-buffer layer 111*a* may be disposed on the second substrate 110*b*, and an active buffer layer 111*b* may be disposed on the multi-buffer layer 111*a*.

A first light blocking layer 135*a* may be disposed on the second substrate 110*b*. However, the present disclosure is not limited thereto, and the first light blocking layer 135*a* may be disposed on the multi-buffer layer 111*a*.

The first light blocking layer 135*a* may serve as a light shield.

The multi-buffer layer 111*a* may be disposed on the first light blocking layer 135*a*.

The active buffer layer 111*b* may be disposed on the multi-buffer layer 111*a*.

The first active layer 134*a* of the driving transistor Ta may be disposed on the active buffer layer 111*b*.

A first gate insulating layer 112*a* may be disposed on the first active layer 134*a*.

Also, a first gate electrode 131*a* of the driving transistor Ta may be disposed on the first gate insulating layer 112*a*.

Also, for example, a gate material layer 136*a* may be disposed on the first gate insulating layer 112*a* at a location different from a location at which the driving transistor Ta is formed. For example, the gate material layer 136*a* may be a first storage electrode, but is not limited thereto.

A first interlayer insulating layer 113*a* may be disposed on the first gate electrode 131*a*.

A metal layer 136*b* may be disposed on the first interlayer insulating layer 113*a*. For example, the metal layer 136*b* may be a second storage electrode, but is not limited thereto.

In this case, the metal layer 136*b* may constitute a storage capacitor together with the gate material layer 136*a*, but is not limited thereto.

Also, for example, a second light blocking layer 135*b* may be disposed on the first interlayer insulating layer 113*a* at a location different from a location at which the metal layer 136*b* is formed.

A buffer layer 111*c* may be disposed on the metal layer 136*b* and the second light blocking layer 135*b*.

A second active layer 134*b* of the switching transistor Tb may be disposed on the buffer layer 111*c*.

A second gate insulating layer 112*b* may be disposed on the second active layer 134*b*.

In addition, a second gate electrode 131*b* of the switching transistor Tb may be disposed on the second gate insulating layer 112*b*.

A second interlayer insulating layer 113*b* may be disposed on the second gate electrode 131*b*.

A first source electrode 132*a* and a first drain electrode 133*a* of the driving transistor Ta may be disposed on the second interlayer insulating layer 113*b*. In addition, a second source electrode 132*b* and a second drain electrode 133*b* of the switching transistor Tb may be disposed on the second interlayer insulating layer 113*b*.

For example, the first source electrode 132*a* and the first drain electrode 133*a* may be electrically connected to one side and the other side of the first active layer 134*a*, respectively through contact holes provided in the second interlayer insulating layer 113*b*, the second gate insulating layer 112*b*, the buffer layer 111*c*, the first interlayer insulating layer 113*a*, and the first gate insulating layer 112*a*.

Further, for example, a part of the first drain electrode 133*a* may be electrically connected to one side of the first light blocking layer 135*a* through contact holes provided in the second interlayer insulating layer 113*b*, the second gate insulating layer 112*b*, the buffer layer 111*c*, the first interlayer insulating layer 113*a*, the first gate insulating layer. 112*a*, the active buffer layer 111*b*, and the multi-buffer layer 111*a*.

In addition, for example, the second source electrode 132*b* and the second drain electrode 133*b* may be electrically connected to one side and the other side of the second active layer 134*b*, respectively, through contact holes provided in the second interlayer insulating layer 113*b* and the second gate insulating layer 112*b*.

A portion of the first active layer 134*a* overlapping the first gate electrode 131*a* is a channel region of the first active layer 134*a*. For example, one of the first source electrode 132*a* and the first drain electrode 133*a* may be connected to one side of the channel region in the first active layer 134*a*, and the other thereof may be connected to the other side of the channel region in the first active layer 134*a*.

Also, a portion of the second active layer 134*b* overlapping the second gate electrode 131*b* is a channel region of the second active layer 134*b*. For example, one of the second source electrode 132*b* and the second drain electrode 133*b* may be connected to one side of the channel region in the second active layer 134*b*, and the other thereof may be connected to the other side of the channel region in the second active layer 134*b*.

Although not shown, a passivation layer may be disposed on the first source electrode 132*a* and the first drain electrode 133*a*, and the second source electrode 132*b* and the second drain electrode 133*b*.

Planarization layers 115*a* and 115*b* may be disposed on the first source electrode 132*a* and the first drain electrode 133*a*, and the second source electrode 132*b* and the second drain electrode 133*b*. For example, the planarization layers 115*a* and 115*b* may include a first planarization layer 115*a* and a second planarization layer 115*b*.

The first planarization layer 115*a* may be disposed on the passivation layer.

A connection electrode 125 may be disposed on the first planarization layer 115*a*.

For example, the connection electrode 125 may be electrically connected to one of the first source electrode 132*a* and the first drain electrode 133*a* through a contact hole provided in the first planarization layer 115*a*.

The second planarization layer 115*b* may be disposed on the connection electrode 125.

A third planarization layer 115*c* may be disposed on the second planarization layer 115*b*.

The third planarization layer 115*c* may be formed of an organic material such as an acrylic resin or an epoxy resin, and may be formed of, for example, photo acryl (PAC). The third planarization layer 115*c* may also be referred to as a planarization layer.

For example, the third planarization layer 115*c* may include first open areas OA1 in which portions corresponding to emission areas of the sub-pixels R, G, and B are removed (opened). The first open area OA1 may have a first width W1.

In other words, the first open area OA1 may be formed in the planarization layers 115*a*, 115*b*, and 115*c*.

The third planarization layer 115*c* may include an upper surface and a side portion.

The upper surface of the third planarization layer 115*c* is a surface located at an uppermost portion of the third planarization layer 115*c* and may be a surface substantially parallel to the second substrate 110*b*.

In addition, the side portion of the third planarization layer 115*c* may be a surface extending laterally from the upper surface of the third planarization layer 115*c*. For example, the side portion of the third planarization layer 115*c* may have a taper at a predetermined angle Θ1.

As the angle Θ1 of the taper increases, an area reflected a light from the emission area increases, so that luminous efficiency can be excellent. However, due to a high angle Θ1 of the taper in processes, there is a possibility of causing disconnection of a cathode 123 stacked thereon. Accordingly, the side portion of the third planarization layer 115*c* may have an angle Θ1 of the taper ranging from 30° to 60° in consideration of luminous efficiency and process reliability, but is not limited thereto.

Also, an anode 121 may be disposed on the upper surface and the side portion of the third planarization layer 115*c* and an upper surface of the second planarization layer 115*b*. For example, the anode 121 may be disposed on the upper surface and the side portion of the third planarization layer 115*c* and the first open area OA1.

In other words, the anode 121 disposed in the first open area OA1 may contact the upper surface of the second planarization layer 115*b*.

For example, the anode 121 may include a first area 121*a* in which a surface thereof is substantially parallel to a surface of the second substrate 110*b* and a second area 121*b* which extends from the first area 121*a* and has a surface having a predetermined angle with respect to the second substrate 110*b* in the first open area OA1. Also, for example, the first area 121*a* of the anode 121 may correspond to the first open area OA1. For example, the second area 121*b* of the anode 121 may correspond to the side portion of the third planarization layer 115*c*. Accordingly, the second area 121*b* of the anode 121 may be referred to as a side portion of the anode 121.

In other words, the first area 121*a* may be disposed on a bottom surface of the first open area OA1, the second area 121*b* may be disposed on a side surface of the first open area OA1, and a third area 121*c* may be formed on an upper surface of the planarization layers 115*a*, 115*b*, and 115*c*.

Also, the anode 121 may include the third area 121*c* that extends from the second area 121*b* and has a surface substantially parallel to the surface of the second substrate 110*b*. The third area 121*c* may correspond to the upper surface of the third planarization layer 115*c*.

As described above, in one sub-pixel R, G, or B, the second planarization layer 115*b* and the third planarization layer 115*c* may include at least one contact hole that is spaced apart from the first open area OA1, and the driving transistor Ta and the anode 121 of the light emitting element 120 may be electrically connected through the contact hole.

A bank 116 may be disposed on the anode 121 to cover the anode 121.

The bank 116 may cover the second area 121*b* and the third area 121*c* of the anode 121. In addition, the bank 116 may partially cover the first area 121*a* of the anode 121. For example, the bank 116 may partially cover an edge of the first area 121*a* of the anode 121.

A portion of the bank 116 corresponding to the emission area of the sub-pixel R, G, or B may be open.

For example, the bank 116 may include a second open area OA2 in which a portion corresponding to the emission area of each of the sub-pixels R, G and B is removed (opened). Also, the second open area OA2 may have a second width W2. Also, the first width W1 of the first open area OA1 may be greater than the second width W2 of the second open area OA2. For example, when viewed from a plan view, the second open area OA2 may have a circular shape, but is not limited thereto.

Next, the bank 116 may include an upper surface, a side portion, and a bottom portion.

For example, the upper surface of the bank 116 is a surface that is located at an uppermost portion of the bank 116 and may be a surface substantially parallel to the second substrate 110*b*. Also, the upper surface of the bank 116 may correspond to the upper surface of the third planarization layer 115*c*.

The side portion of the bank 116 may be a surface extending laterally from the upper surface of the bank 116. The side portion of the bank 116 may have a taper at a predetermined angle Θ2. For example, the side portion of the bank 116 may also have a taper at an angle Θ2 of 30° to 60°, but the present disclosure is not limited thereto. The side portion of the bank 116 may correspond to the side portion of the third planarization layer 115*c*.

For example, the bottom portion of the bank 116 may correspond to a surface in contact with the anode 121 in the first area 121*a* of the anode 121.

The first open area OA1 provided in the third planarization layer 115*c* may have a width that is larger than a width of the second open area OA2 provided in the bank 116. Accordingly, the second open area OA2 may be located within the first open area OA1.

For example, a portion of the anode 121 may be exposed by the second open area OA2.

The bank 116 may be formed of a PI-based material, but is not limited thereto.

The side portion of the bank 116 may have a circular shape similar to an edge of the second open area OA2, but the present disclosure is not limited thereto.

For example, a light emitting layer 122 may be disposed in the second open area OA2 of the bank 116 and a circumference thereof. For example, the light emitting layer 122 may be disposed on the anode 121 that is exposed through the second open area OA2 of the bank 116. For example, the light emitting layer 122 may be disposed within the second open area OA2 of the bank 116.

The light emitting layer 122 may be disposed within the second open area OA2, but the present disclosure is not limited thereto, and a portion of the light emitting layer 122 may be disposed on the upper surface and the side portion of the bank 116 other than the second open area OA2.

The cathode 123 may be disposed on the light emitting layer 122.

In this manner, the light emitting element 120 may be configured by the anode 121, the light emitting layer 122, and the cathode 123.

The encapsulation unit 117 may be disposed over the cathode 123 to protect the light emitting element 120. The light emitting element 120 may react with external moisture and oxygen due to properties of an organic material of a light emitting stack 124 to cause dark-spots or pixel shrinkage. To prevent or at least reduce the dark spots or pixel shrinkage, the encapsulation unit 117 may be disposed over the cathode 126. As shown in FIG. 4, the encapsulation unit 117 may include a first inorganic insulating layer 117*a*, a foreign material compensation layer 117*b*, and a second inorganic insulating layer 117*c*.

The first inorganic insulating layer 117*a* may be disposed over the cathode 126 to be closest to the light emitting element 120. The first inorganic insulating layer 117*a* may be formed of an inorganic insulating material capable of low-temperature deposition such as, silicon nitride (SiNx), silicon oxide (SiOx), silicon oxynitride (SiON), or aluminum oxide ($Al_2O_3$). Since the first inorganic insulating layer 117*a* is deposited in a low-temperature atmosphere, it is possible to prevent damage to the light emitting layer 122 including an organic material vulnerable to a high-temperature atmosphere during deposition.

The foreign material compensation layer 117*b* may have an area that is smaller than an area of the first inorganic insulating layer 117*a*, and the foreign material compensation layer 117*b* may expose both ends of the first inorganic insulating layer 117*a*. The foreign material compensation layer 117*b* may be formed of, for example, an organic insulating material such as acrylic resin, epoxy resin, polyimide, polyethylene, or silicon oxycarbon (SiOC).

Meanwhile, when the foreign material compensation layer 117*b* is formed by an inkjet method, one dam portion or two or more dam portions may be disposed in the dam area DA corresponding to a boundary area between the non-active area and the active area or a partial area within the non-active area. A primary dam portion adjacent to the active area and a secondary dam portion adjacent to a pad unit may be disposed in the dam area DA.

One or more dam portions disposed in the dam area DA may prevent, when the foreign material compensation layer 117*b* in a liquid form is dropped onto the active area, the foreign material compensation layer 117*b* in the liquid form from collapsing in a direction of the non-active area and invading the pad unit.

The primary dam portion and/or the secondary dam portion may have a single-layer or multilayer structure. For example, the primary dam portion and/or the secondary dam portion may be simultaneously formed of the same material as at least one of the bank 116 and a spacer. In this case, a dam structure can be constructed without an additional mask process and a cost increase.

In addition, the foreign material compensation layer 117*b* including an organic material may be located only on an inner surface of the primary dam portion.

In addition, the second inorganic insulating layer 117*c* may be disposed to cover upper and side surfaces of each of the first inorganic insulating layer 117*a* and the foreign material compensation layer 117*b*. The second inorganic insulating layer 117*c* may reduce or block penetration of external moisture or oxygen into the first inorganic insulating layer 117*a* and the foreign material compensation layer 117*b*. The second inorganic insulating layer 117*c* may be formed of an inorganic insulating material such as, silicon nitride (SiNx), silicon oxide (SiOx), silicon oxynitride (SiON), or aluminum oxide ($Al_2O_3$).

A touch buffer layer 118 and a passivation layer 119 may be disposed on the encapsulation unit 117. The touch electrode TE may be disposed on the touch buffer layer 118.

In other words, the touch buffer layer 118 may be located between the touch electrode TE and the encapsulation unit 117.

For example, the touch buffer layer 118 may be designed to maintain a predetermined minimum distance between the touch electrode TE and the cathode 123. Accordingly, a parasitic capacitance that may be formed between the touch electrode TE and the cathode 123 may be reduced or prevented, and through this, a decrease in touch sensitivity due to the parasitic capacitance can be prevented.

Also, a black matrix BM may be disposed on the passivation layer 119.

The black matrix BM may include third open areas OA3 in which portions corresponding to the emission areas of the sub-pixels R, G, and B are removed (open). The third open area OA3 may have a third width W3.

Also, the black matrix BM may be formed of an insulating material containing black dye. Accordingly, light is transmitted only to the third open area OA3 of the black matrix BM, and light is not transmitted to an area where the black matrix BM is disposed.

Also, the third width W3 of the third open area OA3 may be greater than the first width W1 of the first open area OA1. For example, when viewed from a plan view, the third open area OA3 may have a circular shape, but is not limited thereto.

When the third width W3 of the third open area OA3 is smaller than the first width W1 of the first open area OA1, light that is reflected by the anode 121 is blocked by the black matrix BM, so that luminous efficiency can be lowered. Accordingly, the third width W3 of the third open area OA3 is formed to be greater than the first width W1 of the first open area OA1, so that the light that is reflected by the anode 121 is re-reflected by the touch electrode TE, so that luminous efficiency can increase.

The black matrix BM may include an upper surface and a side portion.

The upper surface of the black matrix BM is a surface located at an uppermost portion of the black matrix BM, and may be a surface substantially parallel to the second substrate 110*b*.

In addition, the side portion of the black matrix BM may be a surface extending laterally from the upper surface of the black matrix BM. For example, the side portion of the black matrix BM may have a taper at a predetermined angle Θ3.

As the angle Θ3 of the taper increases, light that is reflected from the emission area increases, so that luminous efficiency can be excellent. Accordingly, the side portion of the black matrix BM may have an angle Θ3 of the taper ranging from 60° to 90° in consideration of luminous efficiency, but is not limited thereto.

Also, the touch electrode TE may be disposed on the upper surface and side portion of the black matrix BM.

In other words, the touch electrode TE is not disposed in the third open area OA3 of the black matrix BM.

For example, the touch electrode TE may include first touch electrodes TE1 in which a surface thereof has at a predetermined angle with respect to the second substrate 110*b* and second touch electrodes TE2 which connect the first touch electrodes TE1 and which has a surface substantially parallel to the surface of the second substrate 110*b*. For example, the first touch electrode TE1 may correspond to the side portion of the black matrix BM. The second touch electrode TE2 may correspond to the upper surface of the black matrix BM.

As described above with reference to FIG. 2, the touch electrode TE including the first touch electrodes TE1 and the second touch electrodes TE2 may be connected to one touch routing line TL.

A color filter GCF may be disposed on the third open area OA3 of the black matrix BM.

The color filter GCF described above may be formed on outer surfaces of the first touch electrode TEL and the second touch electrode TE2 as well as the third open area OA3 of the black matrix BM.

Since FIG. 4 is a cross-sectional view of the green sub-pixel G, it shows that a green color filter GCF is disposed on the third open area OA3 of the black matrix BM. However, the present disclosure is not limited thereto, and a red color filter RCF may be disposed in the red sub-pixel R, and a blue color filter BCF may be disposed in the blue sub-pixel B.

Accordingly, the color filter transmits only light corresponding to a specific color among light emitted from the light emitting layer 122, so that the color of each of the sub-pixels R, G, and B can be realized. For example, only green light may be transmitted through the green color filter GCF disposed in the green sub-pixel G.

In addition, an external light antireflection layer RCF and BCF may be disposed on the touch electrode TE. Specifically, the external light antireflection layer RCF and BCF may be formed by sequentially stacking two color filters of different colors.

As shown in FIG. 4, the red color filter RCF may be disposed on the touch electrode TE, and the blue color filter BCF may be disposed on the red color filter RCF.

An upper surface of the red color filter RCF may be formed at the same height as an upper surface of the green color filter GCF adjacent to the red color filter RCF, but the present disclosure is not limited thereto.

If the external light antireflection layer RCF and BCF is not formed, external light is reflected by the touch electrode TE and recognized by a user, resulting in a decrease in visibility.

However, when the external light antireflection layer RCF and BCF is formed by sequentially stacking the two color filters RCF and BCF of different colors, light of all colors except for blue light in external light is blocked by the blue color filter BCF, which is a first color filter, so that only the blue light can be filtered. In addition, the blue light that is filtered is blocked by the red color filter RCF which is a second color filter, so that light of any color fails to reach the touch electrode TE.

Accordingly, reflection of external light is blocked by the external light antireflection layer RCF and BCF, and visibility can be improved.

An overcoating layer OC may be disposed on the external light antireflection layers RCF and BCF and the color filter. Accordingly, the overcoating layer OC may cover a step difference between the external light antireflection layer RCF and BCF and the color filter GCF and flatten them. The overcoating layer OC may be formed of an organic material such as a transparent acrylic resin or an epoxy resin, and may be formed of, for example, photo acryl (PAC).

Hereinafter, referring to FIG. 5, emission areas of each of the plurality of sub-pixels will be described in detail.

Figure 5:
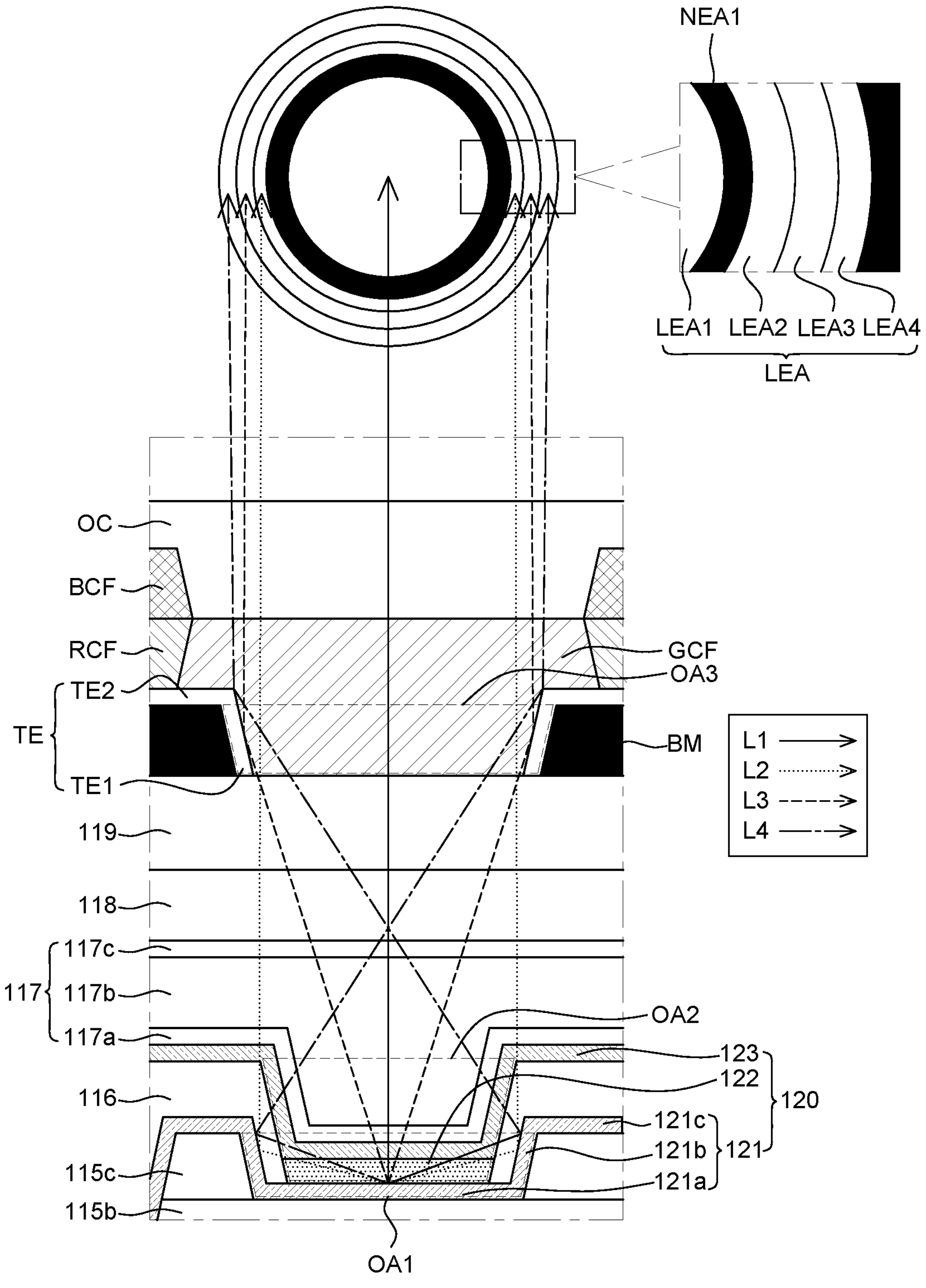
FIG. 5 is a view for explaining emission areas of each of a plurality of sub-pixels according to an exemplary embodiment of the present disclosure.

FIG. 5 is a view for explaining the emission areas of each of the plurality of sub-pixels according to an exemplary embodiment of the present disclosure.

FIG. 5 illustrates light paths of light emitted from the light emitting element 120 disposed in one sub-pixel R, G, or B. Also, in FIG. 5, the emission areas are described as emission areas LEA having a circular shape, but the shape of the emission areas LEA is not limited thereto and may be modified into various shapes.

The emission areas LEA may include a main emission area LEA1 and a plurality of reflective emission areas LEA2, LEA3, and LEA4.

The plurality of reflective emission areas LEA2, LEA3, and LEA4 may be present outside the main emission area LEA1. Specifically, the plurality of emission areas LEA may include a first reflective emission area LEA2 present outside the main emission area LEA1, a second reflective emission area LEA3 present outside the first reflective emission area LEA2, and a third reflective emission area LEA4 present outside the second reflective emission area LEA3.

Referring to a first light path L1 in FIG. 5, light generated from the light emitting layer 122 is not reflected by the anode 121 and the touch electrode TE and goes straight to the color filter GCF, so that the main emission area LEA1 can be formed.

Accordingly, the main emission area LEA1 may not overlap the bank 116. In other words, a width of the main emission area LEA1 may be equal to the second width W2 of the second open area OA2 of the bank 116.

In addition, referring to a second light path L2 in FIG. 5, light generated from the light emitting layer 122 travels in a direction of the anode 121 and may be reflected by the second area 121*b* of the anode 121. In addition, the light reflected by the anode 121 may travel straight to the color filter GCF, so that the first reflective emission area LEA2 may be formed.

Accordingly, the first reflective emission area LEA2 may not overlap the third planarization layer 115*c*. In other words, a width of the first reflective emission area LEA2 may be equal to the first width W1 of the first open area OA1 of the third planarization layer 115*c*.

Also, referring to a third light path L3 in FIG. 5, light generated from the light emitting layer 122 may travel in a direction of the touch electrodes TE and be reflected by the first touch electrode TE1. In addition, light reflected by the first touch electrode TE1 may travel straight to the color filter GCF, so that the second reflective emission area LEA3 may be formed.

Accordingly, the second reflective emission area LEA3 may not overlap the black matrix BM. In other words, a width of the second reflective emission area LEA3 may be equal to the third width W3 of the third open area OA3 of the black matrix.

In addition, referring to a fourth light path L4 in FIG. 5, light generated from the light emitting layer 122 may travel in the direction of the anode 121 and be reflected by the second area 121*b* of the anode 121. Also, the light reflected by the anode 121 may travel in the direction of the touch electrodes TE again and be reflected by the first touch electrode TE1. In addition, the light reflected by the first touch electrode TE1 may travel straight to the color filter GCF, so that the third reflective emission area LEA4 may be formed.

Accordingly, the third reflective emission area LEA4 may overlap the black matrix BM. In other words, a width of the third reflective emission area LEA4 may be greater than the third width W3 of the third open area OA3 of the black matrix.

Since the light along the first light path L1 that forms the main emission area LEA1 described above is not reflected, a luminance of the main emission area LEA1 may be higher than those of plurality of reflective emission areas LEA2, LEA3, and LEA4.

In addition, the light along the second light path L2 that forms the first reflective emission area LEA2 is reflected only by the anode 121 close to the light emitting layer in the light path. Accordingly, the first reflective emission area LEA2 may be narrower than the second reflective emission area LEA3 or the third reflective emission area LEA4. Accordingly, since light is concentrated in the first reflective emission area LEA2 more than in the second reflective emission area LEA3 or the third reflective emission area LEA4, the luminance of the first reflective emission area LEA2 may be higher than that of the second reflective emission area LEA3 or the third reflective emission area LEA4.

In addition, the light along the third light path L3 that forms the second reflective emission area LEA3 is reflected only by the first touch electrode TE1. On the other hand, the light along the fourth light path L4 that forms the third reflective emission area LEA4 is reflected by both the first touch electrode TEL and the anode 121.

Accordingly, a loss of the light along the third light path L3 that forms the second reflective emission area LEA3 may be less than a loss of the light along the fourth light path L4 that forms the third reflective emission area LEA4. Accordingly, the luminance of the second reflective emission area LEA3 may be higher than that of the third reflective emission area LEA4.

Meanwhile, light may not reach a space between the main emission area LEA1 and the first reflective emission area LEA2 and may be disposed in a non-emission area NEA. The non-emission area NEA is an area that is formed without disposing a light emitting material between both ends of the light emitting layer 122 and the anode 121. That is, since the non-emission area NEA is an area that is formed by the bank 116 in contact with the first area of the anode, a width of the non-emission area NEA may be equal to a width of a region in contact with the bank 116 in the first area 121*a* of the anode 121.

That is, in the display device according to an exemplary embodiment of the present disclosure, by forming the touch electrode TE on an inner surface of the black matrix BM, it is possible to prevent or at least reduce light from being absorbed into the black matrix BM and additionally reflect light in front, so that the second reflective emission area LEA3 and the third reflective emission area LEA4 can be further formed.

That is, in the display device according to an exemplary embodiment of the present disclosure, luminous efficiency can be more effectively improved by disposing the touch electrodes on the inner surface of the black matrix.

In addition, the display device according to an exemplary embodiment of the present disclosure may prevent reflection of external light by disposing the external light antireflection layer including two color filters of different colors on the touch electrodes, so that visibility of the display device can be improved.

The exemplary embodiments of the present disclosure can also be described as follows:

A display device according to an exemplary embodiment of the present disclosure includes a substrate divided into a plurality of unit areas; a plurality of sub-pixels disposed in each of the plurality of unit areas of the substrate; an encapsulation unit disposed on the plurality of sub-pixels; a black matrix disposed on the encapsulation unit and having an open area corresponding to an emission area of each of the plurality of sub-pixels; and at least one touch electrode disposed on an upper surface and a side surface of the black matrix, thereby performing a touch function and improving light extraction efficiency.

Each of the plurality of sub-pixels may include a light emitting element.

The light emitting element may include an anode disposed within a first open area formed in a planarization layer on the substrate; a light emitting layer disposed within a second open area formed in a bank on the anode; and a cathode disposed on the light emitting layer.

The anode may include a first area disposed on a bottom surface of the first open area, a second area disposed on a side surface of the first open area, and a third area disposed on the planarization layer.

The cathode may be disposed on a side surface of the second open area.

The first open area and the second open area may correspond to the emission area of each of the plurality of sub-pixels.

A first width of the first open area may be greater than a second width of the second open area.

The black matrix may include a third open area corresponding to the emission area of each of the plurality of sub-pixels.

A third width of the third open area may be greater than the first width of the first open area.

A color filter may be disposed within the third open area of the black matrix.

An external light antireflection layer in which color filters of different colors are stacked may be disposed on the at least one touch electrode.

Each of the at least one touch electrode may include a plurality of first touch electrodes disposed on the side surface of the black matrix; and a plurality of second touch electrodes disposed on the upper surface of the black matrix.

Each of the plurality of first touch electrodes may contact a boundary of each of the plurality of sub-pixels.

Each of the plurality of second touch electrodes may connect the plurality of first touch electrodes.

The plurality of first touch electrodes and the plurality of second touch electrodes may be disposed in each of the plurality of unit areas constitute one touch electrode.

The emission area may include a main emission area and a plurality of reflective emission areas.

The plurality of reflective emission areas may include a first reflective emission area outside the main emission area, a second reflective emission area outside the first reflective emission area, and a third reflective emission area outside the second reflective emission area.

The main emission area may overlap the second open area of the bank.

The first reflective emission area may be formed by light that is reflected only on the anode.

The second reflective emission area may be formed by light that is reflected only on the first touch electrodes.

The third reflective emission area may be formed by light that is reflected from both the anode and the first touch electrodes.

A luminance of the first reflective emission area may be higher than a luminance of the second reflective emission area.

The luminance of the second reflective emission area may be higher than a luminance of the third reflective emission area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate divided into a plurality of unit areas;

a plurality of sub-pixels in each of the plurality of unit areas of the substrate;

an encapsulation unit on the plurality of sub-pixels;

a black matrix on the encapsulation unit, the black matrix having an open area corresponding to an emission area of each of the plurality of sub-pixels; and at least one touch electrode on an upper surface and a side surface of the black matrix, wherein an external light antireflection layer in which color filters of different colors are stacked is on the at least one touch electrode.

2. The display device of claim 1, wherein each of the plurality of sub-pixels includes a light emitting element, the light emitting element including:

an anode within a first open area in a planarization layer on the substrate;

a light emitting layer within a second open area in a bank on the anode; and a cathode on the light emitting layer, and wherein the anode includes a first area on a bottom surface of the first open area, a second area on a side surface of the first open area, and a third area on the planarization layer.

3. The display device of claim 2, wherein the cathode is on a side surface of the second open area.

4. The display device of claim 2, wherein the first open area and the second open area correspond to the emission area of each of the plurality of sub-pixels, and a first width of the first open area is greater than a second width of the second open area.

5. The display device of claim 4, wherein the black matrix includes a third open area corresponding to the emission area of each of the plurality of sub-pixels.

6. The display device of claim 5, wherein a third width of the third open area is greater than the first width of the first open area.

7. The display device of claim 5, wherein a color filter is within the third open area of the black matrix.

8. The display device of claim 2, wherein the at least one touch electrode comprises a plurality of touch electrodes that each includes:

a plurality of first touch electrodes on the side surface of the black matrix; and a plurality of second touch electrodes on the upper surface of the black matrix.

9. The display device of claim 8, wherein each of the plurality of first touch electrodes contacts a boundary of each of the plurality of sub-pixels, and each of the plurality of second touch electrodes connects the plurality of first touch electrodes.

10. The display device of claim 8, wherein the plurality of first touch electrodes and the plurality of second touch electrodes in each of the plurality of unit areas constitute one touch electrode.

11. The display device of claim 8, wherein the emission area includes a main emission area and a plurality of reflective emission areas, wherein the plurality of reflective emission areas include a first reflective emission area outside the main emission area, a second reflective emission area outside the first reflective emission area, and a third reflective emission area outside the second reflective emission area.

12. The display device of claim 11, wherein the main emission area overlaps the second open area of the bank.

13. The display device of claim 11, wherein light is reflected on the anode in the first reflective emission area, wherein light is reflected on the plurality of first touch electrodes in the second reflective emission area, and wherein light is reflected from both the anode and the plurality of first touch electrodes in the third reflective emission area.

14. The display device of claim 11, wherein a luminance of the first reflective emission area is greater than a luminance of the second reflective emission area, and the luminance of the second reflective emission area is greater than a luminance of the third reflective emission area.

* * * * *